US007061063B2

(12) United States Patent
Kato et al.

(10) Patent No.: US 7,061,063 B2
(45) Date of Patent: Jun. 13, 2006

(54) MICROSTRUCTURE AND ITS FABRICATION METHOD

(75) Inventors: Takahisa Kato, Palo Alto, CA (US); Kazutoshi Torashima, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/608,111

(22) Filed: Jun. 30, 2003

(65) Prior Publication Data

US 2004/0075522 A1 Apr. 22, 2004

(30) Foreign Application Priority Data

Jul. 5, 2002 (JP) ............................ 2002-197130

(51) Int. Cl.
*H01L 29/84* (2006.01)

(52) U.S. Cl. ...................................... 257/417; 257/431

(58) Field of Classification Search ................ 257/415, 257/416–421, 431
See application file for complete search history.

(56) References Cited

U.S. PATENT DOCUMENTS 5,177,579 A * 1/1993 Jerman ........................ 73/724
5,231,879 A * 8/1993 Yamamoto ............... 73/514.33
5,982,521 A 11/1999 Bessho et al. .............. 359/198
6,051,866 A * 4/2000 Shaw et al. ................. 257/417
6,632,698 B1 * 10/2003 Ives ........................... 438/52
6,774,445 B1 * 8/2004 Mutoh et al. ............... 257/415
6,863,832 B1 3/2005 Wiemer et al. ................ 216/2

FOREIGN PATENT DOCUMENTS

DE 41 26 100 2/1993
JP 9-230275 9/1997
WO WO 01/07869 2/2001

OTHER PUBLICATIONS

L. Muller, et al., "Mechanical Performance of Integrated Microgimbal/Microactuator for Disk Drives", Transducers '99, The 10 International Conference on Solid-State Sensors and Actuators, pp. 1002-1005 (Jun. 7-10, 1999).

* cited by examiner

*Primary Examiner*—N. Drew Richards
(74) *Attorney, Agent, or Firm*—Fitzpatrick, Cella, Harper & Scinto

(57) ABSTRACT

A microstructure includes a support substrate, a movable plate, and an elastic support portion having a first section with at least one concave portion and second sections having no concave portion. The second sections are arranged at both longitudinal ends of the first section and connect with the movable plate and the support substrate, respectively. The movable plate is supported by the elastic support portion so that the movable plate can be freely torsion-vibrated to the support substrate about a torsion axis.

9 Claims, 14 Drawing Sheets

MICROSTRUCTURE AND ITS FABRICATION METHOD

BACKGROUND OF THE INVENTION

1. Field of the Invention

The present invention relates to a microstructure and its fabrication method on the field of micromachines. More particularly, the present invention relates to a micro dynamic-value sensor, microactuator and micro optical deflector each having a member torsion-vibrating about a torsion axis.

2. Related Background Art

In recent years, various units have been improved for high function and small size because of development of micro-electronics as represented by high integration degree of semiconductor devices. The same is said for an apparatus using a micromachine device (such as a micro optical deflector, micro dynamic-value sensor or microactuator having a member torsion-vibrating about a torsion axis). For example, an image display apparatus such as a laser-beam printer or head-mount display which performs optical scanning by using an optical deflector, and a light-capturing apparatus of an input device such as a bar code reader have been also improved for high function and small size and moreover, application of them to a portable product is desired. Furthermore, not only the application of a micro-machine device to the portable product but also improvement of performances of the device such as stability of torsional vibration such as external vibration to noises, impact resistance and service life have been particularly requested to the device in addition to further down sizing of the device for practical use.

For example, Japanese Patent Application Laid-Open No. 09-230275, 10$^{th}$ International Conference on Solid-State Sensors and Actuators (Transducers '99) pp. 1002–1005 is disclosed as a proposal for the above request.

(First Conventional Example)

FIG. 16 is a perspective view showing a micro optical deflector of the first conventional example disclosed in U.S. Pat. No. 5,982,521.

A torsion spring 1005 is set to a housing 1001 by a fixing jig 1002 while it is pulled at a tension. Moreover, a magnet-provided mirror 1003 is fixed nearby the center of the torsion spring 1005 by an adhesive (not shown). The magnet-provided mirror 1003 is made of Ni—Co (nickel-cobalt) or Sm—Co (samarium-cobalt) having a thickness of 0.3 mm, a length of 3 mm and a width of 6 mm. The torsion spring 1005 is made of a superelastic alloy (e.g. Ni—Ti alloy) and has a central portion of about 140 μm in line diameter and about 10 mm in length. Moreover, the portion where the torsion spring 1005 is fixed to the housing 1001 is thicker than the central portion to which the magnet-provided mirror 1003 is fixed, as a result of electroless plating or the like. The fixed portion with the housing serves as a housing fixed portion 1013.

Moreover, a coil 1007 is wound on a core 1006 by about 300 turns. The coil 1007 is fixed to the housing 1001 by a screw (not shown) through a tapped hole 1008 formed on the core 1006 and a hole 1004 formed on the housing 1001. Furthermore, a pulse-current generator 1009 is connected to the both ends of the wound wire of the coil 1007. By supplying a current at, for example 3 V and about 100 mA to the coil, an alternate magnetic field is generated and the magnet-provided mirror 1003 vibrates. A laser beam 1010 emitted from a light source 1011 is reflected from the magnet-provided mirror 1003 and the magnet-provided mirror 1003 resonates and thereby, the laser beam is canned on a plane 1012 to be scanned.

The housing fixed portion 1013 is tapered by coating processing such as electroless plating. Therefore, it is possible to moderate concentration of stress on the housing fixed portion 1013 at the time of driving and moreover, the torsion spring 1005 is prevented from disconnection.

(Second Conventional Example

FIG. 14 is a top view of the hard-disk-head gimbals of the second conventional example disclosed in 10$^{th}$ International Conference on Solid-State Sensors and Actuators (Transducers '99) pp. 1002–1005. The gimbals are set to the front end of a hard-disk-head suspension to elastically allow a magnetic head to roll and pitch. The gimbals 2020 have a support frame 2031 rotatably supported by roll torsion bars 2022 and 2024 inside. Moreover, a head support 2030 rotatably supported by pitch torsion bars 2026 an 2028 is formed inside the support frame 2031. Torsional axes (refer to the orthogonal chain lines in FIG. 14) of the roll torsion bars 2022 and 2024 and pitch torsion bars 2026 and 2028 are orthogonal to each other and take charge of roll and pitch of the head support 2030 respectively.

FIG. 15 is a sectional view taken along the cutting-plane line 2006 in FIG. 14. As shown in FIG. 15, the sectional shape of the torsion bar 2022 is T-shaped and the gimbals 2020 are constituted so as to have a rib.

As shown in FIG. 15, the torsion bar having the T-shaped cross section has a large moment of inertia of the cross section though it has a small polar moment of inertia of the cross section compared to the case of a torsion bar having a circular cross section or rectangular cross section. Therefore, it is possible to provide a torsion bar which is not easily deflected though comparatively easily twisted. That is, it is possible to provide a torsion bar having a high stiffness in the direction vertical to the torsion axis while securing a sufficient compliance in the torsional direction.

Moreover, there is an advantage that it is possible to further downsize a torsion bar because it is possible to provide a short torsion bar for obtaining a necessary compliance.

Thus, by using the above torsion bar having a T-shaped cross section, it is possible to provide microgimbals which have a sufficient compliance in roll and pitch directions and a sufficient stiffness in other directions and which can be further downsized.

However, the first and second conventional examples have the problems described below.

In the case of the first conventional example, the torsion spring 1005 is a wire rod and its sectional shape is circular. A microstructure having a torsion spring of the above sectional shape has a problem that the structure cannot be accurately driven because its torsion spring is easily deflected to receive the structure external vibrations or move the torsion axis of the torsion spring.

Moreover, because the torsion spring 1005 is easily deflected due to an external impact, there is a problem that the magnet-provided mirror 1003 is greatly displaced in the translational direction (that is, direction vertical to torsion axis) and thereby, a trouble that the torsion spring 1005 is broken easily occurs.

Therefore, when applying the above micro optical deflector to a light scanning display, there is a problem that an image is deformed due to external vibrations or a spot shape is changed. Moreover, there is a problem that a display is broken due to an impact. This leads to a larger problem when a light scanning display is formed into a portable type.

Moreover, in the case of the first conventional example, the torsion spring 1005 is formed so that the wire diameter of the housing fixed portion 1013 fixed to the housing 1001 becomes large for the support portion which supports the magnet-provided mirror 1003. Stress concentration caused by torsional vibration also occurs in the housing fixed portion 1013. However, because the torsional vibration is a relative movement of the magnet-provided mirror 1003 to the housing 1001, stress concentration also occurs in the support portion which supports the magnet-provided mirror 1003 of the torsion spring 1005. Therefore, the first conventional example has a problem that stress concentration on the support portion supporting the magnet-provided mirror 1003 in the torsion spring 1005 cannot be moderated and thereby, the effect of preventing disconnection of the torsion spring 1005 cannot be sufficiently expected.

Finally, the sectional shape of the portion of the torsion spring 1005 to be mainly displaced in the torsional direction is circular and the housing fixed portion 1013 is designed so as to obtain the effect of preventing disconnection by further increasing the wire diameter from the above portion to be mainly displaced. However, there is a problem that the housing 1001 for fixing the housing fixed portion 1013 must be also increased in size because of the structure of the housing fixed portion 1013. Particularly, to downsize a micro optical deflector, dimensions including the thickness of the housing 1001 and the wire diameter of the torsion spring 1005 become larger problems because they become similar on order.

The second conventional example has a problem that the T-shaped-cross-sectional torsion bar is easily broken because stress is concentrated on the support portions at the both ends of the torsion bar (for example, the support portion for the head support 2030 and the support portion for the support frame 2031 in the roll torsion bars 2028 and 2026, or the support portion for the support frame 2031 and the support portion for the gimbals 2020 in the roll torsion bars 2022 and 2024). Therefore, unless the torsion bar is set long enough, it is impossible to drive the torsion bar at a large displacement angle. Thereby, not only downsizing is impossible but also the torsion bar is easily deflected even if greatly lengthening the torsion bar and the head support 2030 is greatly translated in the direction vertical to the torsion axis due to an external impact. Therefore, when mounting the hard-disk-head gimbals of the second conventional example on a hard disk, trouble occurs in the hard disk because the gimbals contact with a recording medium due to an external vibration or impact or a head is broken. This becomes a larger problem when the hard disk is formed into a portable type.

Moreover, there is a problem that a large stress is repeatedly loaded due to the above stress concentration even if a breakage does not occur and thereby, a torsion bar easily early causes a fatigue failure due to a repetitive stress.

The present invention has been accomplished to solve the above conventional problems and its object is to provide a compact microstructure having less unnecessary vibrations and a long service life even at a large torsional angle and its fabrication method and an optical apparatus using the microstructure.

SUMMARY OF THE INVENTION

Therefore, the present invention provides a microstructure having a support substrate and a movable plate, in which the movable plate is supported to the support substrate by an elastic support portion so that the plate can be freely torsion-vibrated about a torsion axis, wherein the elastic support portion has at least one concave portion, at the both ends of a first section in which a concave portion is formed, a second section in which the concave portion is not formed is arranged, and the second section is connected with the movable plate and the support substrate.

Moreover, the present invention provides a microstructure fabrication method comprising: a step of forming mask layers on the both faces of a silicon substrate; a step of removing the mask layer on a first face among the mask layers but leaving the mask layer on the contour portions of a support substrate, an elastic support portion and a movable plate; a step of removing the mask layer opposite to the first mask face among the mask layers but leaving the mask layer on the contour portions of the support substrate, the elastic support portion and the movable plate, and removing the mask layer on a portion for forming a concave portion of the elastic support portion; a step of dividing the silicon substrate into the support substrate, the elastic support portion and the movable plate and forming a concave portion on the elastic support portion by immersing the silicon substrate in an alkaline aqueous solution to subject the substrate to anisotropic etching; and a step of removing the mask layers on the silicon substrate.

Moreover, the present invention provides a microstructure fabrication method comprising: a step of forming mask layers on the both faces of a silicon substrate; a step of removing the mask layers on the both faces of the mask layer but leaving the mask layers on the contour portions of a support substrate, an elastic support portion and a movable plate, and moreover removing the mask layer on a portion for forming a concave portion of the elastic support portion; a step of dividing the silicon substrate into the support substrate, the elastic support portion and the movable plate and forming a concave portion on the elastic support portion by immersing the silicon substrate in an alkaline aqueous solution to subject the substrate to anisotropic etching and a step of removing the mask layers on the silicon substrate.

DETAILED DESCRIPTION OF THE PREFERRED EMBODIMENTS

Embodiments of the present invention are described below in detail by referring to the accompanying drawings.

(First Embodiment)

{General Description, Mirror (Movable Plate Portion)}

Figure 1:
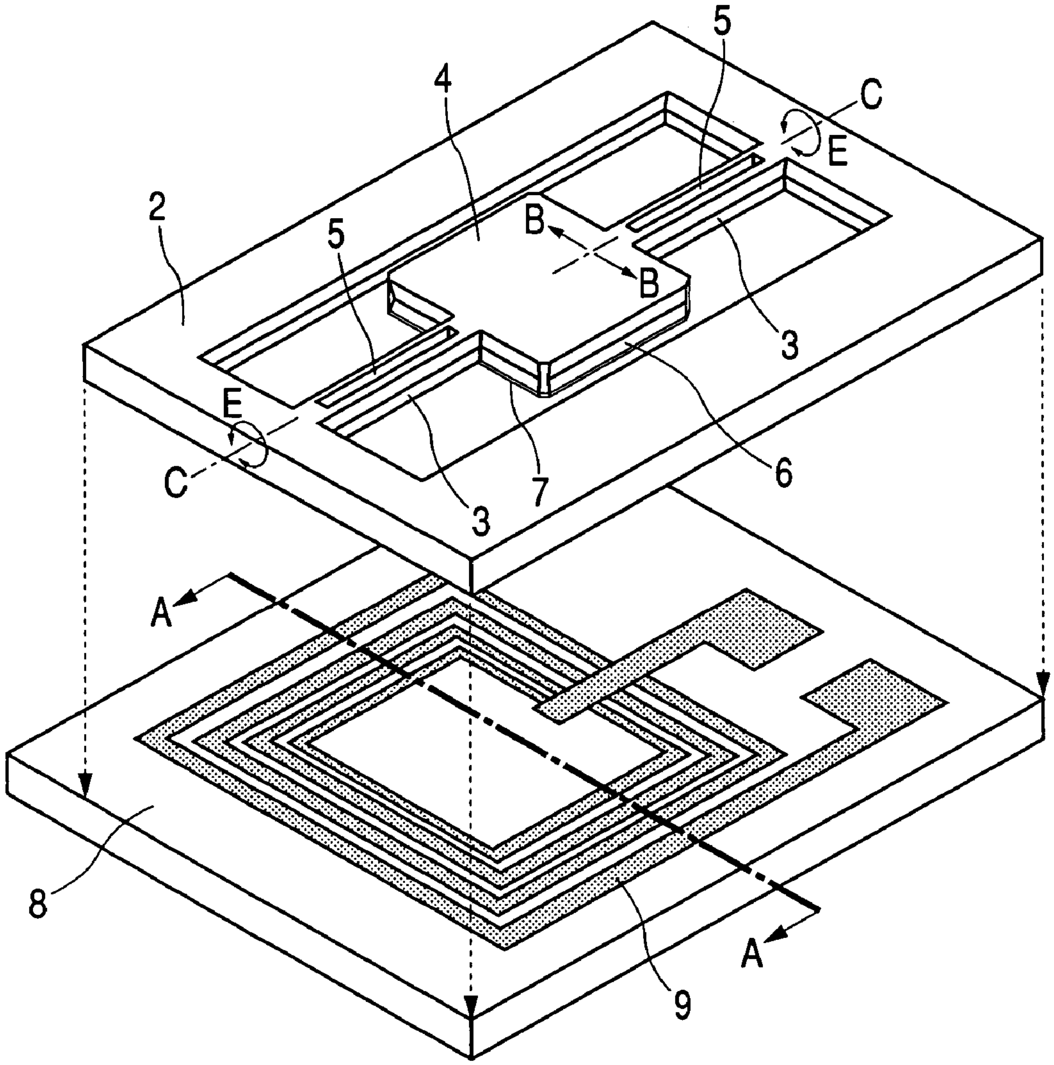
FIG. 1 is a perspective view showing a micro optical deflector of a first embodiment of the present invention.

FIG. 1 is a perspective view showing a configuration of the micro optical deflector of the first embodiment of the present invention. In FIG. 1, a micro optical deflector 1 has a structure in which both ends of a movable plate. 6 are supported to a support substrate 2 by an elastic support portion 3. The elastic support portion 3 elastically supports the movable plate 6 in the direction E about the axis C (that is, torsion axis) so that the movable plate 6 can be freely torsion-vibrated. Moreover, as shown in FIG. 1, a concave portion 5 is formed on the elastic support portion 3. Furthermore, one face of the movable plate 6 serves as a reflection plane 4 which deflects the light incoming to the reflection plane 4 by a predetermined displacement angle due to the E-directional torsion of the movable plate 6.

Moreover, because the micro optical deflector 1 serving as a microstructure can torsion-vibrate the movable plate 6 by using driving means, it is possible to provide an actuator by the microstructure and driving means. The driving means relatively drives a support substrate and movable plate. In the case of this embodiment, the driving means uses a magnet or coil to be described later. When using a magnet or coil, it is possible to provide an electromagnetic actuator.

(Magnet)

Moreover, a permanent magnet 7 such as a rare-earth-based permanent magnet containing samarium, iron and nitrogen is set to a face (hereafter, referred to as "back") opposite to the face on which the reflection plane 4 is formed. Furthermore, the permanent magnet 7 is magnetized so that S and N poles are opposite to each other with interposition of the torsion axis C.

(Integral Formation, Mirror Substrate)

The support substrate 2, movable plate 6, reflection plane 4, elastic support portion 3 and concave portion 5 are integrally formed by single-crystal silicon in accordance with the micromachining technique to which the semiconductor manufacturing technology is applied.

(Description of Coil Substrate)

Moreover, a coil substrate 8 is set in parallel with the support substrate 2 so that a coil 9 serving as magnetism generation means is set nearby the permanent magnet 7 by keeping a desired distance from the magnet 7. The coil 9 is integrally formed in a spiral shape by electroplating, for example, copper on the surface of the coil substrate 8 as shown in FIG. 1.

(Operations)

Figure 2:
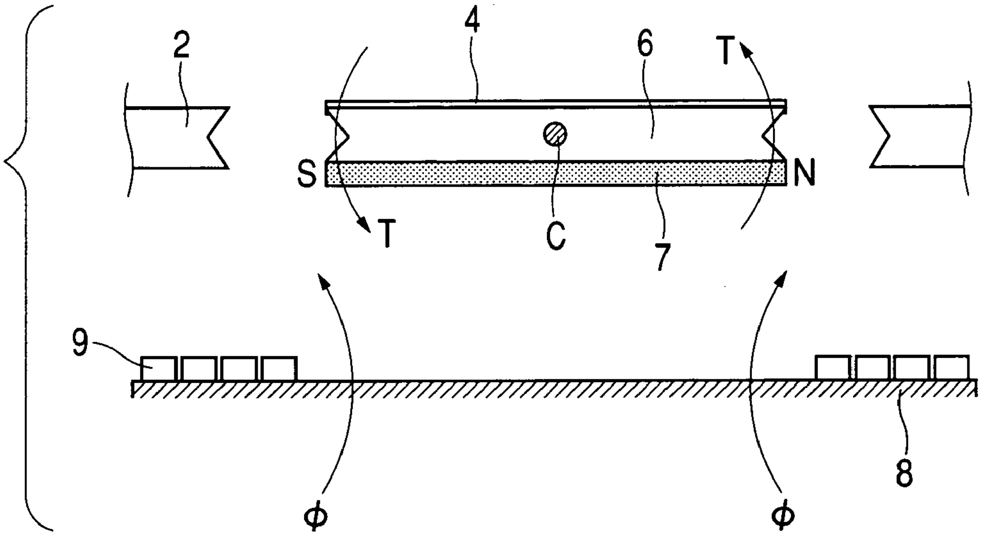
FIG. 2 is a sectional view taken along the line A—A in FIG. 1.

Operations of the micro optical deflector 1 of this embodiment are described below by referring to FIG. 2. FIG. 2 is a sectional view taken along the line A—A of the micro optical deflector 1 in FIG. 1. As shown in FIG. 2, the permanent magnet 7 is magnetized so that S and N poles are opposite to each other with interposition of the torsion axis C. The direction is shown in FIG. 2. By supplying a current to the coil 9, a magnetic flux Φ is generated in relation to the direction of the current to be supplied such as the direction in FIG. 2. An attraction and repulsion are generated on magnetic poles of the permanent magnet 7 in directions relating to the magnetic flux, and a torque T acts on the movable plate 6 elastically supported about the torsion axis C. Similarly, by reversing the direction of the current to be supplied to the coil 9, a torque T acts in the opposite direction. Therefore, as shown in FIG. 2, it is possible to drive the movable plate 6 by an optional angle in accordance with the current to be supplied to the coil 9. In FIG. 2, numeral 2 denotes a support substrate, 4 a reflection plane, and 8 a coil substrate.

(Resonation)

Moreover, by supplying an alternating current to the coil 9, it is possible to continuously torsion-vibrate the movable plate 6. In this case, by almost equalizing the frequency of the alternating current with the resonant frequency of the movable plate 6 and resonating the movable plate 6, a larger displacement angle can be obtained.

(Scale)

The micro optical deflector 1 of this embodiment is driven at 19 kHz which is the resonant frequency of the movable plate 6 and a mechanical displacement angle of ±1020 . The support substrate 2, movable plate 6 and elastic support potion 3 are constituted to have an equal thickness of 150 μm, and the B-directional (direction A—A in FIG. 1) width of the movable plate 6 is set to 1.3 mm and the torsion-axis-directional length of the plate 6 is set to 1.1 mm. That is, the surface of the movable plate has an area of about several $mm^2$ (particularly, an area equal to or less than 2 $mm^2$) and the movable-plate-provided support substrate is a microstructure.

(Detailed Description of Configuration of Elastic Support Portion)

The elastic support portion 3 and concave portion 5 are described below which are features of the present invention.

Figure 3:
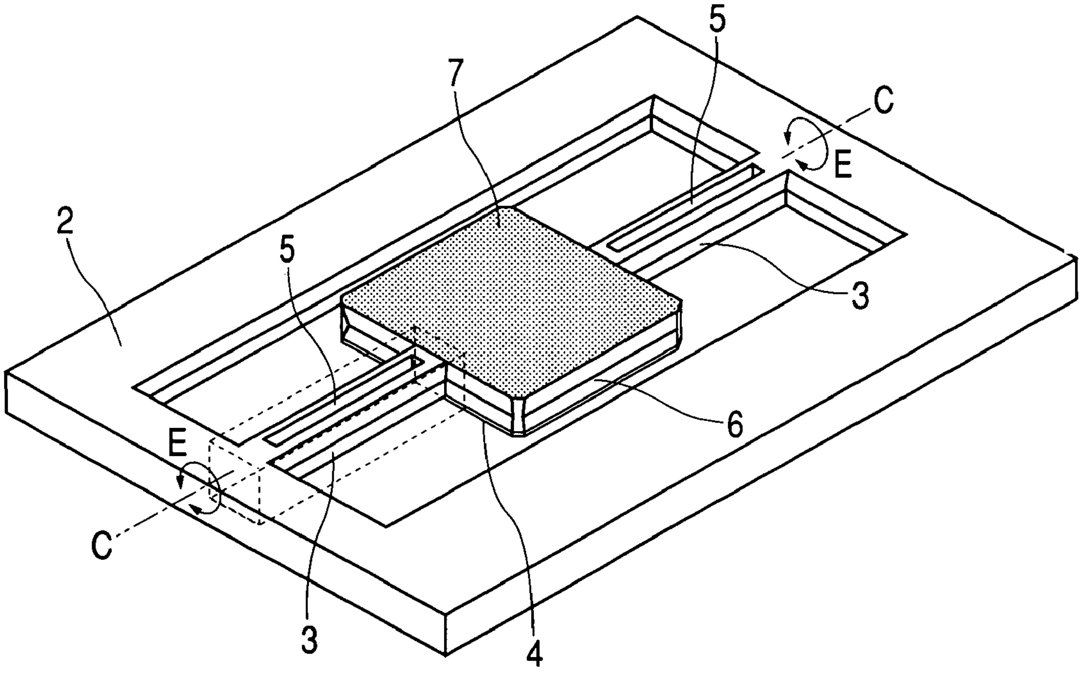
FIG. 3 is a perspective view for explaining a support substrate, movable plate, elastic support portion, concave portion and permanent magnet in FIG. 1.

FIG. 3 is a perspective view of the support substrate 2 when viewing it from the back of it.

As shown in FIG. 3, in the case of this embodiment, the concave portion 5 is formed on the elastic support portion 3. As shown in FIGS. 1 and 3, the concave portion 5 is formed on the surface where the reflection plane 4 is formed and the back of the elastic support portion 3 respectively. Moreover, two elastic support portions 3 which support the movable plate 6 have the same shape.

Therefore, the elastic support portion 3 and concave portion 5 enclosed by a broken line in FIG. 3 are described below by referring to FIGS. 4A and 4B and FIGS. 5A to 5D.

Figure 4A:
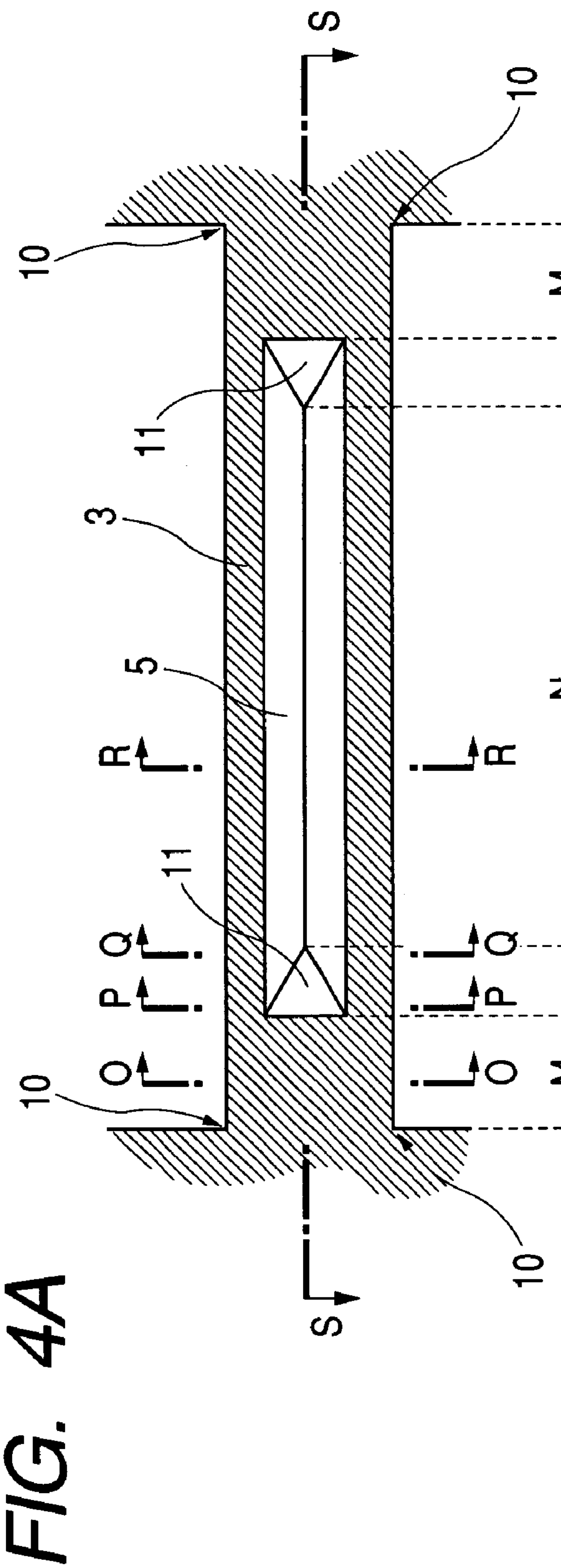
FIG. 4A is a top view for explaining the elastic support portion and concave portion in FIG. 1
Figure 4B:
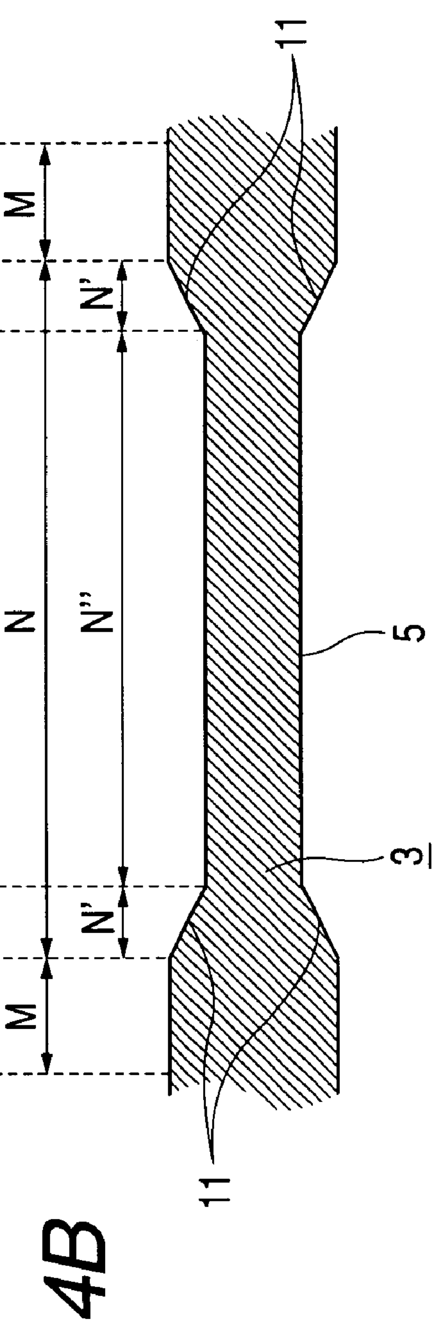
FIG. 4B is a sectional view taken along the line S—S in FIG. 4A.

FIG. 4A is a top view obtained by particularly enlarging the elastic support portion 3 enclosed by a broken line in FIG. 3 and FIG. 4B is a sectional view taken along the line S—S in FIG. 4A. Moreover, FIGS. 5A to 5D show sectional views of the elastic support portion 3 taken along the lines O—O, P—P, Q—Q and R—R shown in FIGS. 4A and 4B.

As shown in FIG. 4A, the concave portion 5 is not formed at the both ends of the elastic support portion 3 in the torsion-axis direction, that is, one end of the portion 3 connected with the movable plate 6 and the other end of the portion 3 connected with the support substrate 2. Therefore, the elastic support portion 3 is constituted so that a section N in which the concave portion 5 is formed is put between sections M in which the concave portion 5 is not formed. Numeral 10 denotes a corner.

FIG. 4B shows a sectional view taken along the line S—S in FIG. 4A. In the case of the micro optical deflector 1 of this embodiment, the concave portion 5 is constituted by the four (111) equivalent planes of silicon crystal planes. Among the four silicon crystal planes, two inclined planes 11 shown in FIGS. 4A and 4B are tilted by approx. 54.7° from the (100) equivalent plane which is a plane forming on the reflection plane and its back respectively, as illustrated. The section in which the inclined planes 11 are formed is referred to as a section N' and other section N is referred to as a section N". Therefore, in the case of the optical deflector 1 of this embodiment, the elastic support portion 3 is formed so that the section N in which the concave portion 5 is formed is put between the sections M in which the concave portion 5 is not formed and in the section N, and the section N" is interposed by the sections N' in which the inclined plane 11 is formed. In this case, the (111) equivalent plane and (100) equivalent plane are general names of crystal planes shown by the planes (111), (1-1-1), (-1-11) and (-100).

(Description That Sectional Shape Changes)

Figure 5A:
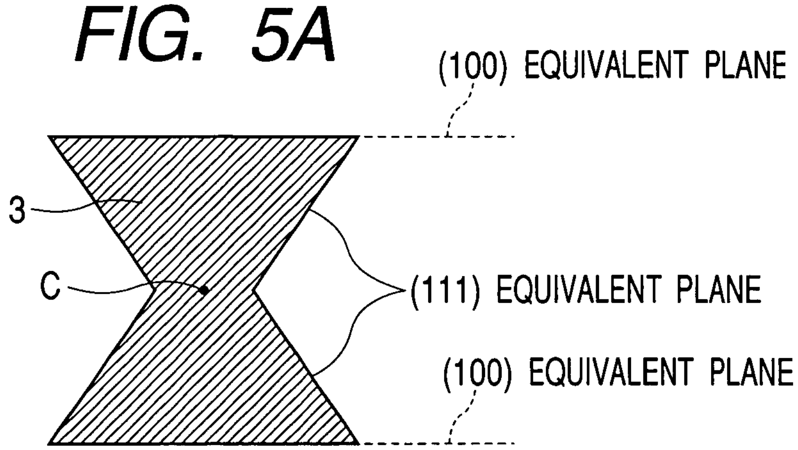
FIGS. 5A, 5B, 5C and 5D are sectional views taken along the lines O—O, P—P, Q—Q and R—R in FIG. 4A.

FIG. 5A shows a sectional shape of the elastic support portion 3 in the section M (line O—O in FIGS. 4A and 4B). Reference symbol C denotes a torsion-axis.

Figure 5B:
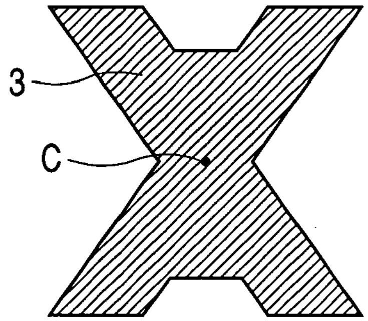
Figure 5C:
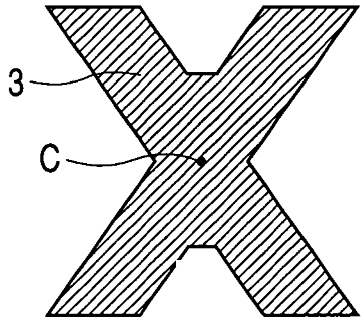
Figure 5D:
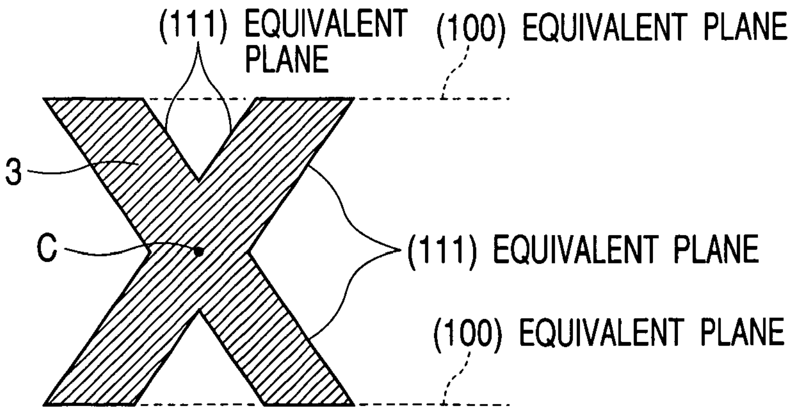

FIG. 5D shows a sectional shape in the section N" (line R—R in FIG. 4). In the section N", the sectional shape of the elastic support portion 3 becomes an X-shaped polygon because the concave portion 5 is formed. That is, the cross section of the section N" has a small polar moment of inertia of the cross section compared to the cross section of the section M in FIG. 5A.

When the concave portion 5 is not formed on the elastic support portion 3, large stress concentration occurs at corners 10 shown in FIG. 4A and this becomes a main factor of breakage of the elastic support portion 3. However, by forming the concave portion 5, the elastic support portion 3 of this embodiment has a small polar moment of inertia of the cross section from the section M to the section N". Therefore, the torsion angle θ in the section M becomes smaller per unit length than that in the section N and thereby, corners 10 are not greatly strained. Therefore, it is possible to moderate stress concentration on the corners 10.

Moreover, the sectional shape of the section N" still has a large moment of the inertia of cross section in the direction causing a deflection vertical to the torsion axis even when the concave portion 5 is formed, and it is possible to realize an elastic support portion which does not easily cause unnecessary vibrations other than torsional vibration or unnecessary displacement.

FIGS. 5B and 5C show sectional shapes in the section N' (taken along the lines P—P and Q—Q in FIGS. 4A and 4B, respectively). As shown in FIG. 4B, the concave portion 5 formed on the inclined planes 11 is made deeper toward the section N" from the section M by the inclined planes 11 formed in the section N'. Therefore, as shown in FIGS. 5B and 5C, the sectional shape becomes an intermediate polygon slowly changing from the section M to the section N".

Therefore, because the polar moment of inertia of the cross section also continuously changes, it is possible to further moderate new stress concentration caused at a sudden change point, compared to the case in which change of shapes from the section M to the section N" suddenly occurs, and realize a more preferable conformation.

Thus, as typically shown as the section M and section N for this embodiment, by forming a concave portion on an elastic support portion, it is possible to moderate the stress concentration caused nearby the both ends of the elastic support portion, prevent the elastic support portion from breaking, and improve a micro optical deflector for wide deflection angle and long service life. Moreover, by forming a sectional shape having a small polar moment of inertia of the cross section and a comparatively large moment of inertia of the cross section like the section N, it is possible to realize a micro optical deflector which can be easily twisted and which does not cause unnecessary vibration or displacement against external vibration or impact in the direction vertical to a torsion axis.

The above effect is not restricted to only the sectional shape of an elastic support portion and concave portion of this embodiment. It is possible to achieve the objects of the present invention by using an optional elastic support portion and concave portion.

Moreover, as particularly shown as the section N' in which the inclined plane 11 is typically formed, it is possible to further moderate stress concentration and constitute a micro optical deflector of the present invention into a more preferable mode by tilting the side wall of a concave portion from a face vertical to a torsion axis so that an intermediate sectional shape is formed between a section in which the concave portion is not formed and a section in which the concave portion is formed.

Moreover, by integrally forming the support substrate 2, movable plate 6, elastic support portion 3 and concave portion 5 from single-crystal silicon like this embodiment, it is possible to realize a micro optical deflector having a large mechanical Q value. This shows that the vibration amplitude for input energy at the time of resonant driving increases. Therefore, a micro optical deflector of the present invention can be formed into a compact and power-saving deflector at a large deflection angle.

Furthermore, in the case of this embodiment, by forming the sectional shape of the section N" into an X-shaped polygon, it is possible to realize a sectional shape having a smaller polar moment of inertia of the cross section and a larger moment of inertia of the cross section. Furthermore, because it is possible to realize a mode in which the torsion axis C almost passes through the center of gravity of the movable plate 6, it is possible to decrease the displacement from the axis C of torsional vibration. Therefore, it is possible to form a micro optical deflector of the present invention into a more preferable mode.

Moreover, in the case of this embodiment, a sectional shape vertical to the torsion axis C of the movable plate 6 constituted by the (100) and (111) equivalent planes formed simultaneously with an elastic support portion is a polygon of which the side wall is caved as shown in FIG. 2. Therefore, compared to the case in which the cross section of a movable plate is rectangular, the moment of inertia is reduced and at the same time, the stiffness is kept high.

Therefore, even when driving a micro optical deflector at a high speed, a reflection plane is only slightly deformed and even when setting a resonant frequency high, it is possible to set a spring constant of the torsion of an elastic support portion at a low value. Therefore, a large deflection angle is obtained at a small torque.

(Fabrication Process)

Figure 6A:
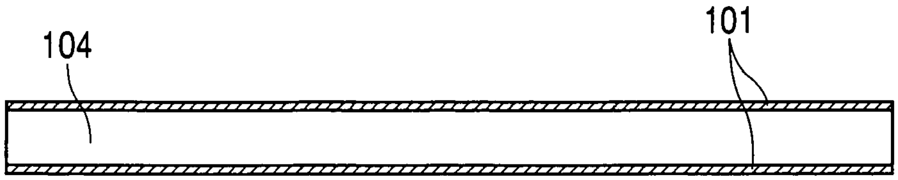
FIGS. 6A, 6B, 6C, 6D and 6E are illustrations for explaining a fabrication method of the optical deflector in FIG. 1.

Then, fabrication methods of the support substrate 2, elastic support portion 3, movable plate 6 and concave portion 5 of this embodiment are described below by referring to FIGS. 6A to 6E and FIGS. 7A to 7F. FIGS. 6A to 6E and FIGS. 7A to 7F are process charts showing fabrication methods of the support substrate 2, elastic support portion 3, movable plate 6 and concave portion 5 in accordance with anisotropic etching using an alkaline aqueous solution. Particularly, FIGS. 6A to 6E show schematic views of fabrication steps in cross sections taken along the line A—A in FIG. 1 and FIGS. 7A to 7F show schematic views of fabrication steps in cross sections taken along the line R—R in FIG. 4A. First, as shown in FIG. 6A, mask layers 101 made of silicon nitride are formed on the both faces of a flat plate-shaped silicon substrate 104 in accordance with the low pressure chemical vapor deposition method or the like.

Figure 6B:
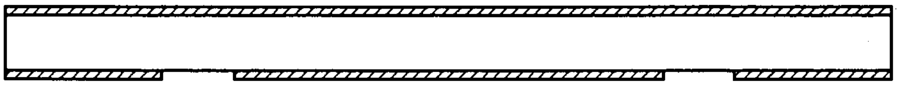
Figure 6C:
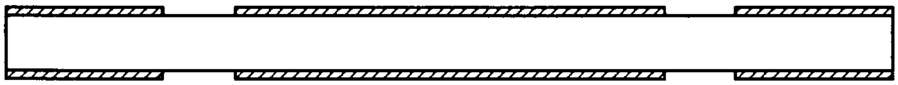

Then, as shown in FIG. 6B, the mask layer 101 on the face on which a reflection plane 4 is formed is patterned in accordance with the contour of the support substrate 2, movable plate 6, elastic support portion 3 and concave portion 5 to be formed. The above patterning is performed by normal photolithography and dry etching using a gas which corrodes silicon nitride (for example, $CF_4$) . Moreover, as shown in FIG. 6C, the mask layer 101 is patterned on a face on which the reflection plane 4 is not formed in accordance with the contour of the support substrate 2, movable plate 6, elastic support portion 3 and concave portion 5 to be formed. Also in this case, the patterning is performed in accordance with the same method as that in FIG. 6B.

Figure 6D:
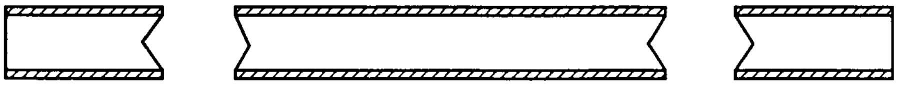

Then, as shown in FIG. 6D, anisotropic etching is performed by immersing the silicon substrate in an alkaline aqueous solution (such as potassium-hydroxide aqueous solution and tetramethylammonium-hydroxide aqueous solution) having corrosion rates extremely different from each other depending on the crystal plane of single-crystal silicon for a desired period to form the support substrate 2 and movable plate 6 shown in FIG. 6D. In this case, the elastic support portion 3 and concave portion 5 are also formed at the same time. The anisotropic etching has a large etching rate on the (100) equivalent plane and a small etching rate on the (111) equivalent plane. Therefore, by progressing etching from the surface and back of the silicon substrate 104, it is possible to accurately form a shape enclosed by the (100) plane of the portion covered with the mask layer 101 and the (111) plane in accordance with the relation between the pattern of the mask layer 101 and the crystal plane of silicon. Details of the formation processes of the elastic support portion 3 and concave portion 5 in the above anisotropic etching step will be described later in detail by referring to FIGS. 7A to 7F.

Figure 6E:
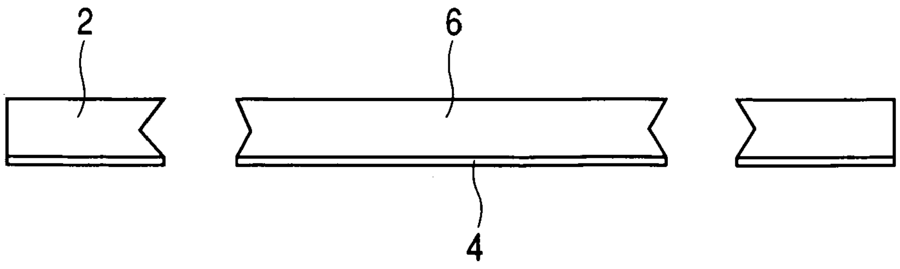

Then, as shown in FIG. 6E, the mask layer 101 made of silicon nitride is removed and moreover, a metal having a high reflectance (such as aluminum) is vacuum-deposited as the reflection plane 4. According to the above fabrication method, the support substrate 2, movable plate 6 on which the concave portion 5 is formed, reflection plane 4, elastic support portion 3 and concave portion 5 are integrally formed.

Thereafter, a paste-like magnetic material obtained by mixing rare-earth-based fine particles containing samarium, iron and nitrogen with a junction material is formed on the back of the movable plate 6. In this case, for example, it is possible to form the magnetic material only on the back of the movable plate 6 through silk screen printing. Finally, the movable plate 6 is heated in a magnetic field and then magnetized (for magnetizing direction, refer to FIG. 2) to form the permanent magnet 7. Thus, the micro optical deflector 1 as shown in FIG. 1 is completed.

(Fabrication Process (Formation Process of Torsion Bar Serving as Elastic Support Portion and Concave Portion)

In this case, the formation process of the elastic support portion 3 and concave portion 5 in the anisotropic etching step shown in FIG. 6D is described below in detail by referring to FIGS. 7A to 7F.

Figure 7A:
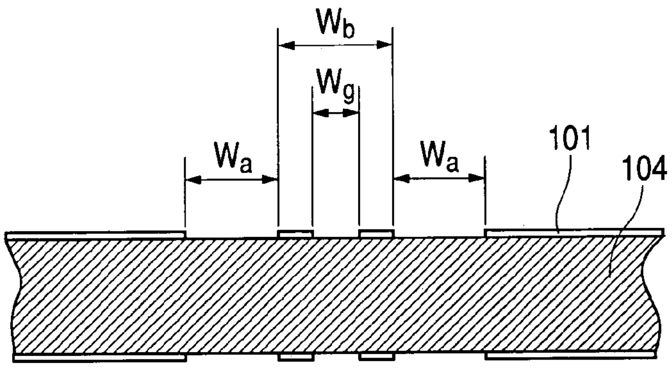
FIGS. 7A, 7B, 7C, 7D, 7E and 7F are illustrations for explaining a step of forming an elastic support portion and a concave portion in the optical-deflector fabrication method in FIGS. 6A to 6E.

As shown in FIG. 7A, an opening 191 having a width of Wa along contours of the elastic support portion 3 and movable plate 6 is formed on the mask layer 101, formed in the preceding step, corresponding to the contour of the portion in which the elastic support portion 3 and concave portion 5 and moreover, an opening 190 having a width of Wg is formed along the contour of the concave portion 5.

Figure 7B:
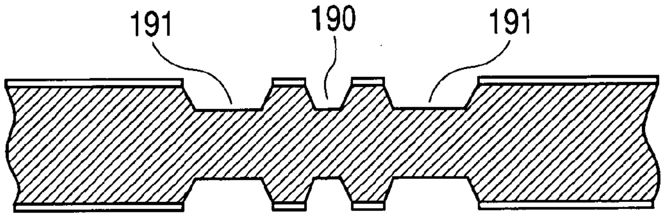

In this case, for example, as shown in FIG. 7B, both faces of the silicon substrate 104 are etched by using a potassium-hydroxide aqueous solution. As described above, the etching progresses so that an opening becomes smaller as the etching becomes deeper in accordance with the etching-rate difference between the (100) and (111) equivalent planes.

Figure 7C:
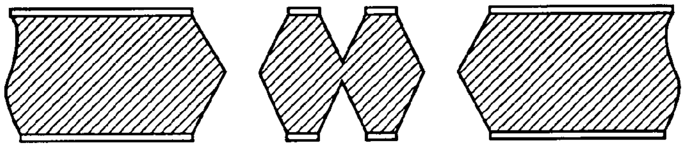

Then, as shown in FIG. 7C, in the case of the opening 190, all planes become the (111) equivalent plane and etching stops before the opening 190 having the width of Wg reaches the center of the silicon substrate 104. Therefore, the V-shaped concave portion 5 is formed. Moreover, in the case of the opening 191 having the width of Wa, etching progresses until the etching penetrates the substrate. As shown in FIG. 4B, because the (111) equivalent plane tilts by 54.7° from the (100) equivalent plane, the relation between the width w of the opening and the depth of the V-shaped concave portion 5 is shown as $d=w/2 \tan 54.7°$. That is, relations of $Wg<t/\tan 54.7°$ and $Wa>t/\tan 54.7°$ are satisfied. In this case, t denotes the thickness of the silicon substrate 104.

Figure 7D:
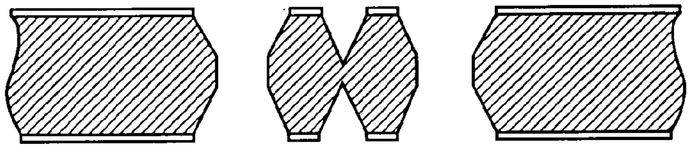
Figure 7E:
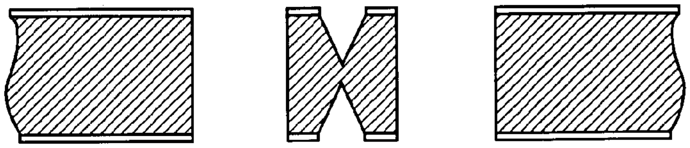

Then, as shown in FIGS. 7D and 7E, after a hole penetrates from the top and bottom of the opening 191, etching progresses sideward.

Figure 7F:
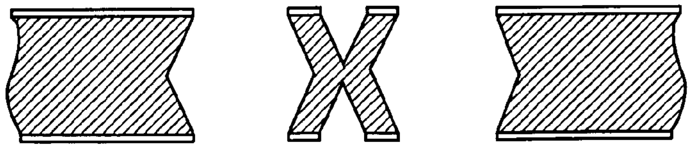

Finally, as shown in FIG. 7F, the sidewall reaches the (111) equivalent plane and etching stops. Therefore, a caved shape of the (111) equivalent plane is formed on side faces of the elastic support portion 3 and movable plate 6 (refer to FIG. 6D). Moreover, the sectional shape of the elastic support portion 3 taken along the line R—R in FIGS. 4A and 4B is formed into an X-shaped polygon.

Thus, according to the fabrication method of the micro optical deflector 1 of this embodiment, it is possible to form structures of the movable plate 6, elastic support portion 3 and concave portion 5 through one-time alkaline anisotropic etching. Therefore, it is possible to fabricate micro optical deflectors in large quantities very inexpensively. Moreover, it is possible to correspond to design modification by adjusting a mask pattern and the etching time by photolithography. Therefore, it is possible to fabricate a micro optical deflector more inexpensively in a shorter development period. Moreover, because shapes of the movable plate 6, elastic support portion 3 and concave portion 5 are decided in accordance with the (111) equivalent plane of single-crystal silicon, it is possible to form the shapes at a high accuracy.

(Diffraction Grating)

Though the reflection plane 4 is used in FIG. 1, it is possible to constitute a micro optical deflector which performs the same operation in accordance with torsional vibration of the movable plate 6 even if the reflection plane 4 uses a reflective diffraction grating. In this case, because deflected light serves as diffracted light for incident light, it is possible to obtain a plurality of deflected rays from one beam.

(Second Embodiment)

(General Description: Mechanical Sensor)

Figure 8:
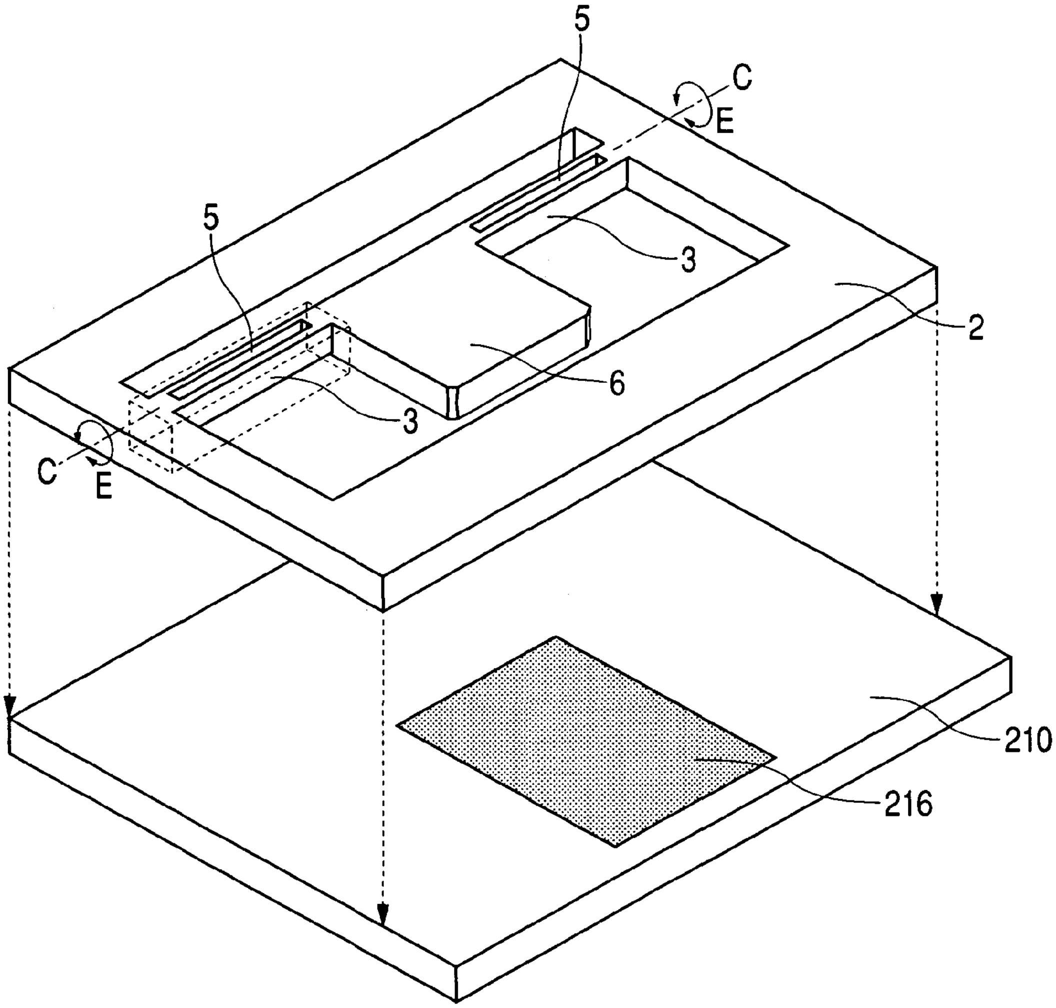
FIG. 8 is a perspective view showing an acceleration sensor of a second embodiment of the present invention.

FIG. 8 is a perspective view showing a configuration of an acceleration sensor serving as the mechanical sensor of the second embodiment of the present invention. In FIG. 8, the acceleration sensor 21 has a structure in which both ends of a movable plate 6 are supported to a support substrate 2 by an elastic support portion 3. The elastic support portion 3 elastically supports the movable plate 6 about the axis C (that is, torsion axis) so that it can be freely torsion-vibrated in the direction E. Moreover, a concave portion 5 is formed on the elastic support portion 3 as shown in FIG. 8. In FIG. 8, the same member as that in FIG. 1 is denoted by the same numeral (Description of Detection Electrode and Insulating Substrate)

Moreover, an insulating substrate 210 is set in parallel with the support substrate 2 so that a detection electrode 216 is set opposite to the movable plate 6 nearby the movable plate 6 by keeping a desired distance from the plate 6. The insulating substrate 210 is electrically grounded. For example, the detection electrode 216 is formed by vacuum-depositing aluminum on the insulating substrate 210, photolithgraphing and etching the detection electrode 216 along the contour of the electrode 216 and patterning the electrode 216. It is possible to adhere the support substrate 2 which is a silicon substrate and the insulating substrate 210 together through a spacer (not shown) so as to arrange the substrates 2 and 210 in parallel by keeping a desired distance between them.

(Acceleration Sensor, Electrostatic Actuator and Principle)

When acceleration acts in the direction vertical to the support substrate 2, an inertial force acts on the movable plate 6 and the movable plate 6 is displaced in the direction E about the torsion axis C of the elastic support portion 6. When the movable plate 6 is displaced in the direction E, the electrostatic capacity between the movable plate 6 and detection electrode 216 changes because the distance between the movable plate 6 and the detection electrode 216 changes. Therefore, by detecting the electrostatic capacity between the detection electrode 216 and movable plate 6, it is possible to detect acceleration.

However, when applying a voltage between the movable plate 6 and detection electrode 216, electrostatic attraction acts between the movable plate 6 and detection electrode 216 and the movable plate 6 is displaced in the direction E about the torsion axis C of the elastic support portion 3. That is, the acceleration sensor of this embodiment can be used as an electrostatic actuator.

(Detailed Description of Elastic Support Portion 3 and Concave Portion 5)

The elastic support portion 3 and concave portion 5 enclosed by a broken line in FIG. 8 are described below by referring to FIGS. 9A and 9B and FIGS. 5A to 5D.

The elastic support portion 3 and concave portion 5 of this embodiment have the same effect as that of the elastic support portion 3 and concave portion 5 of the first embodiment. The difference between the first embodiment and the second embodiment lies in sectional shapes of the elastic support portion 3 and concave portion 5 and the difference is described below.

Figures 9A, 9B:
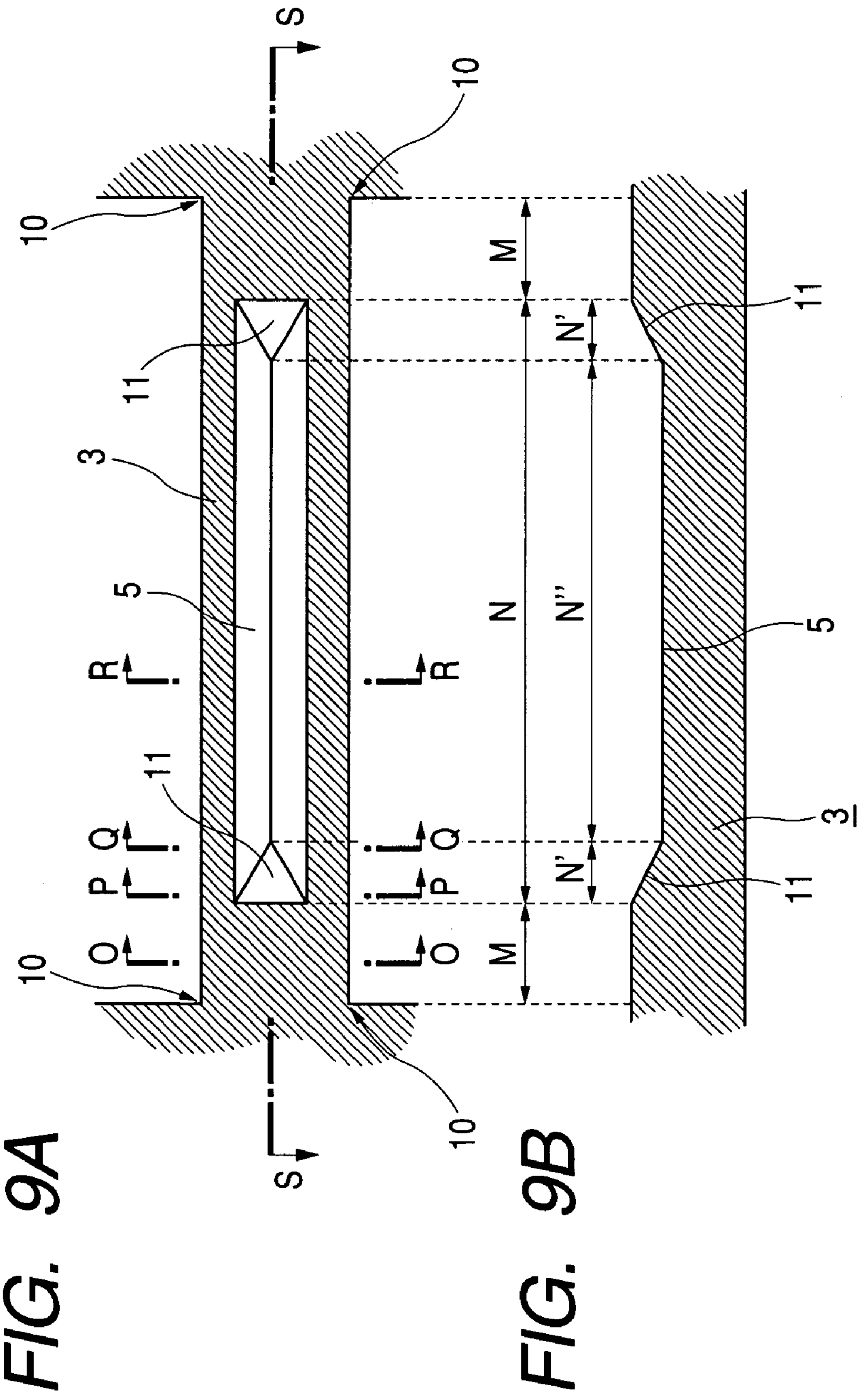
FIG. 9A is a top view for explaining an elastic support portion and a concave portion in FIG. 8
FIG. 9B is a sectional view taken along the line S—S in FIG. 9A.

FIG. 9A is a top view obtained by particularly enlarging the elastic support portion 3 and concave portion 5 enclosed by the broken line in FIG. 8 and FIG. 9B is a sectional view taken along the line S—S in FIG. 9A. Moreover, FIGS. 10A to 10D show sectional views of the elastic support portion 3 taken along the lines O—O, P—P, Q—Q and R—R shown in FIGS. 9A and 9B.

As shown in FIG. 9A, the concave portion 5 is not formed nearby both ends of the elastic support portion 3 but a section N in which the concave portion 5 is formed is interposed between sections M in which the concave portion 5 is not formed.

FIG. 9B shows a cross section taken along the line S—S in FIG. 9A. The concave portion 5 is formed by four (111) equivalent planes of silicon crystal planes. Among the (111) equivalent planes, two inclined planes 11 shown in FIG. 9A and 9B tilt from the (100) equivalent plane by an angle of approx. 54.7° as illustrated. The section in which the inclined plane 11 is formed is referred to as a section N' and the other section in the section N is referred to as N". Therefore, in the case of this embodiment, the elastic support portion 3 is constituted so that the section N in which the concave portion 5 is formed is interposed between the sections M in which the concave portion 5 is not formed and moreover, the section N" is interposed between sections N' in which the inclined plane 11 is respectively formed in the section N.

Figure 10A:
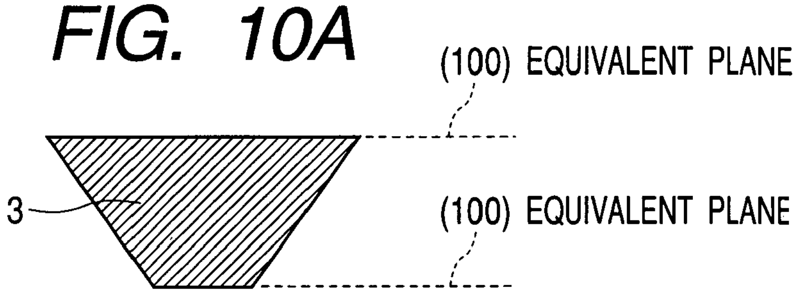
FIGS. 10A, 10B, 10C and 10D are sectional views taken along the lines O—O, P—P, Q—Q and R—R in FIG. 9A.

FIG. 10A shows the sectional shape of the elastic support portion 3 in the section M (taken along the line O—O in FIG. 9A) which is almost trapezoidal.

Figure 10B:
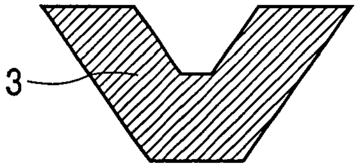
Figure 10C:
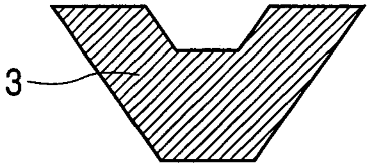
Figure 10D:
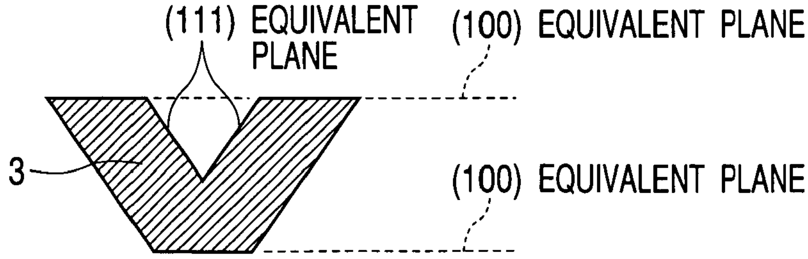

FIG. 10D shows the sectional shape of the section N" (taken along the line R—R in FIG. 9A), in which the sectional shape of the elastic support portion 3 becomes a V-shaped polygon by forming the concave portion 5 therein.

Moreover, FIGS. 10B and 10C show sectional shapes of the section N' (taken along the lines P—P and Q—Q in FIG. 4A). Because the concave portion 5 at this portion becomes deeper from the section-M side toward the section-N" side, it becomes an intermediate polygon in which the sectional shape slowly changes from the section M to the section N".

That is, because the sectional shape changes from the section M to the section N' and section N", the same effect as the case of the change of the sectional shape from the section M to the section N' and section N" in the first embodiment is obtained. Therefore, stress concentration on the corners 10 in FIG. 9A is moderated and it is possible to realize an elastic support portion which does not easily cause unnecessary vibration or unnecessary displacement other than torsional vibration.

(Special Effect of V-Shape Cross Section)

In the case of this embodiment, it is possible to realize a sectional shape having a smaller polar moment of inertia of the cross section and a larger moment of inertia of the cross section by particularly forming the sectional shape of the section N" into a V-shaped polygon. Therefore, it is possible to form an acceleration sensor of the present invention into a preferable mode.

{Fabrication Process (Formation Process of Torsion Bar Serving as Elastic Support Portion and Concave Portion)}

Then, fabrication methods of the support substrate 2, elastic support portion 3, movable plate 6 and concave portion 5 of this embodiment are described below by referring to FIGS. 11A to 11E. FIGS. 11A to 11E particularly show sectional views taken along the line R—R in FIGS. 9A and 9B and describe the formation process of the elastic support portion 3 and concave portion 5 in anisotropic etching steps in detail.

Figure 11A:
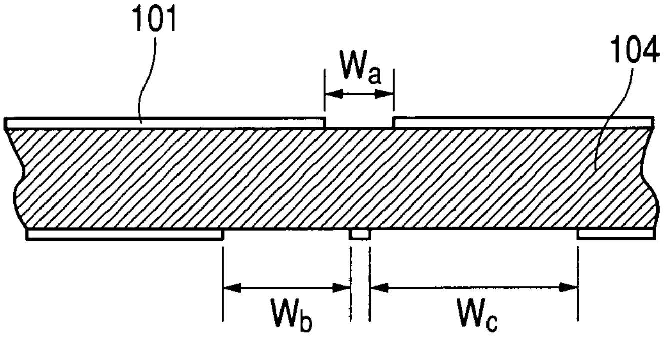
FIGS. 11A, 11B, 11C, 11D and 11E are illustrations for explaining a fabrication method of the acceleration-sensor in FIG. 8.

First, as shown in FIG. 11A, a mask layer 101 made of silicon nitride is formed on the both faces of a flat plate-shaped silicon substrate 104 by the low-pressure chemical-vapor-phase synthetic method or the like to pattern the mask layer 101 in accordance with the contour of the elastic support portion 3 and concave portion 5 to be formed. The above patterning is performed by normal photolithography and dry etching using a gas which corrodes silicon nitride (such as $CF_4$). In the case of the formed pattern, openings having widths of Wa, Wb and Wc are formed on the upper and lower faces of the silicon substrate 104 as shown in FIG. 11A. Openings 191 having widths of Wb and Wc are formed along contours of the elastic support portion 3 and movable plate 6 and moreover, an opening 190 having a width of Wa is formed along the contour of the concave portion 5.

Figure 11B:
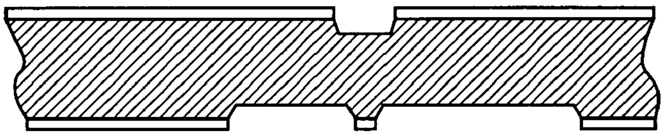

In this case, as shown in FIG. 11B, the both faces of the silicon substrate 104 are etched by using, for example, a potassium-hydroxide aqueous solution. As described above, etching first progresses so that an opening becomes smaller as the etching becomes deeper because of the difference in etching rate between the (100) and (111) equivalent planes.

Figure 11C:
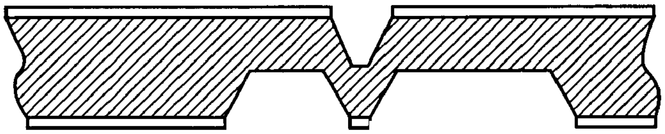

Then, as shown in FIG. 11C, in the case of the opening 190 having the width of Wa, all planes become the (111) equivalent plane before the etching reaches the center of the silicon substrate 104 and the etching stops. Therefore, the V-shaped concave portion 5 is formed. Moreover, in the case of the opening 191 having the width of Wa, etching processes until it penetrates the substrate. As described above, because the (111) equivalent plane tilts from the (100) equivalent plane by an angle of 54.7°, the relation between the width w of the opening and the depth of the V-shaped concave portion 5 is shown as $d=w/2 \tan 54.7°$. That is, relations of $Wa<t/\tan 54.7°$, and Wb and $Wc>t/\tan 54.7°$ are satisfied. In this case, t denotes the thickness of the silicon substrate 104.

Figure 11D:
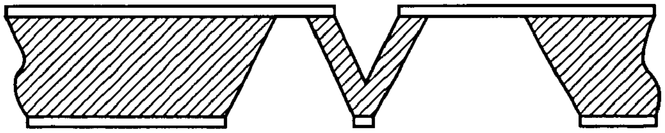

Then, as shown in FIG. 11D, the etching from the lower face progresses until it penetrates the silicon substrate 104 and stops at the mask layer 101.

In the above anisotropic etching step, the sectional shape of the elastic support portion 3 taken along the line R—R in FIGS. 9A is formed into a V-shaped polygon enclosed by the (100) and (111) equivalent planes.

At the same time, the support substrate 2 and movable plate 6 are also formed into shapes enclosed by the (100) and (111) planes shown in FIG. 8 in the etching step.

Figure 11E:
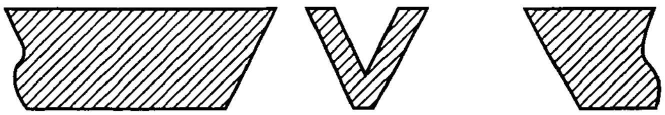

Finally, as shown in FIG. 11E, the mask layer 101 is removed and the support substrate 2, elastic support portion 3, movable plate 6 and concave portion 5 are integrally formed.

(Third Embodiment)

Figure 12:
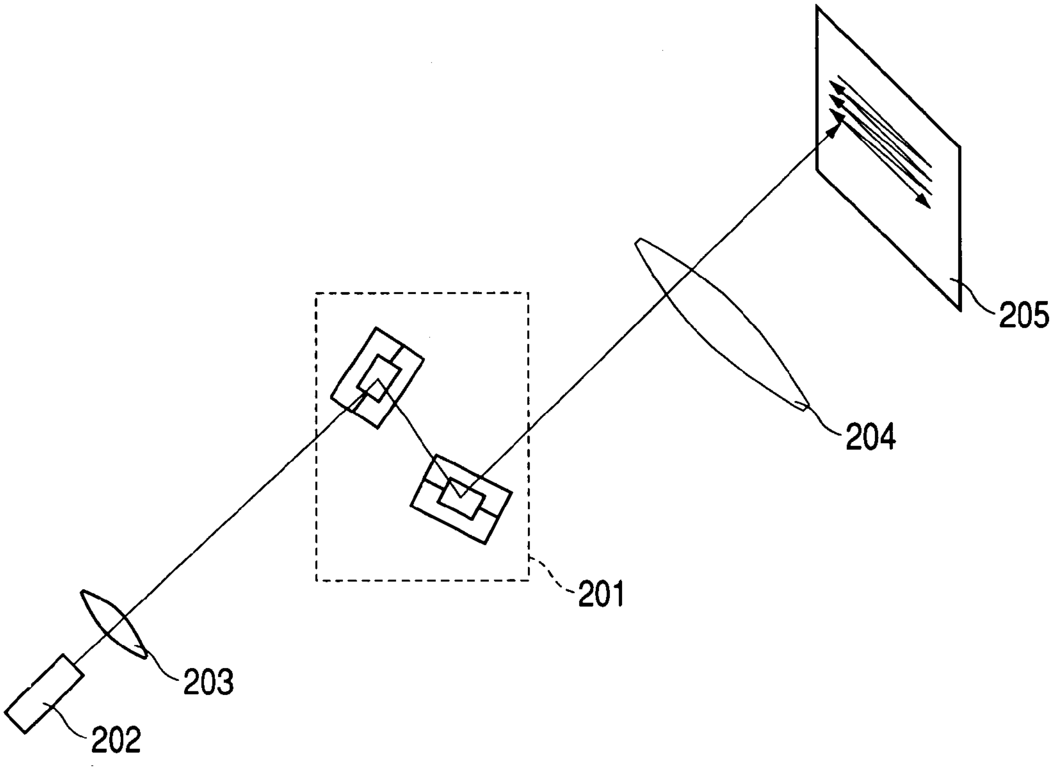
FIG. 12 is an illustration showing an embodiment of an optical apparatus using a micro optical deflector of the present invention.

FIG. 12 is an illustration showing an embodiment of an optical apparatus using the above micro optical deflector. In this case, an image display apparatus is shown as an optical apparatus. In FIG. 12, numeral 201 denotes a micro optical deflector group 21 in which two micro optical deflectors of the first embodiment are arranged so that their deflective directions are orthogonal to each other and which is used as an optical scanner system for raster-scanning incident light in horizontal and vertical directions in the case of this embodiment. Numeral 202 denotes a laser beam source. Numeral 203 denotes a lens or a lens group, 204 denotes a write lens or a write lens group and 205 denotes a projection plane. A laser beam incoming from the laser beam source 202 undergoes predetermined intensity modulation relating to light scanning timing and performs two-dimensional scanning by the micro optical defector group 201. The laser beam used for the scanning forms an image on the projection plane 205 by the write lens 204. That is, the image display apparatus of this embodiment can be applied to a display.

(Fourth Embodiment)

Figure 13:
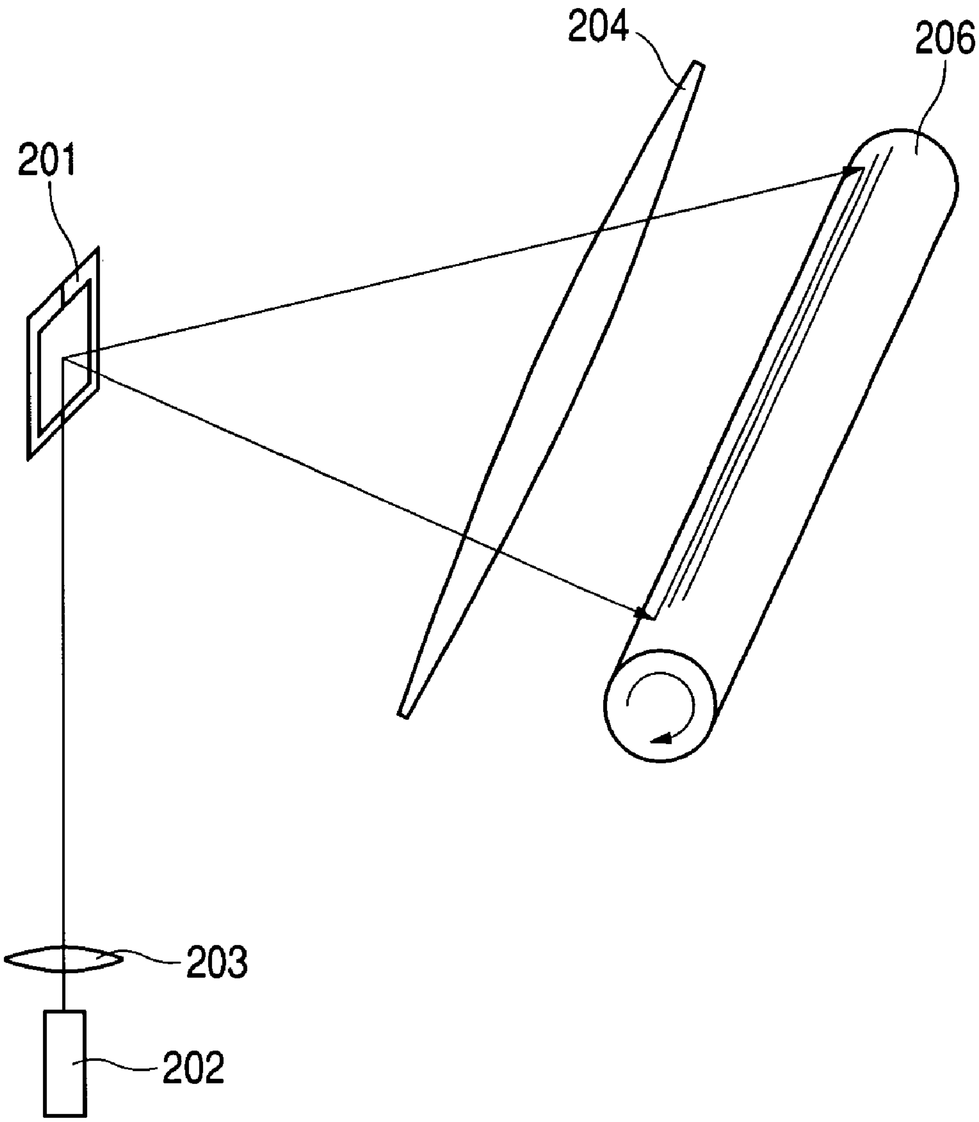
FIG. 13 is an illustration showing another embodiment of the optical apparatus using the micro optical deflector of the present invention.
Figure 14:
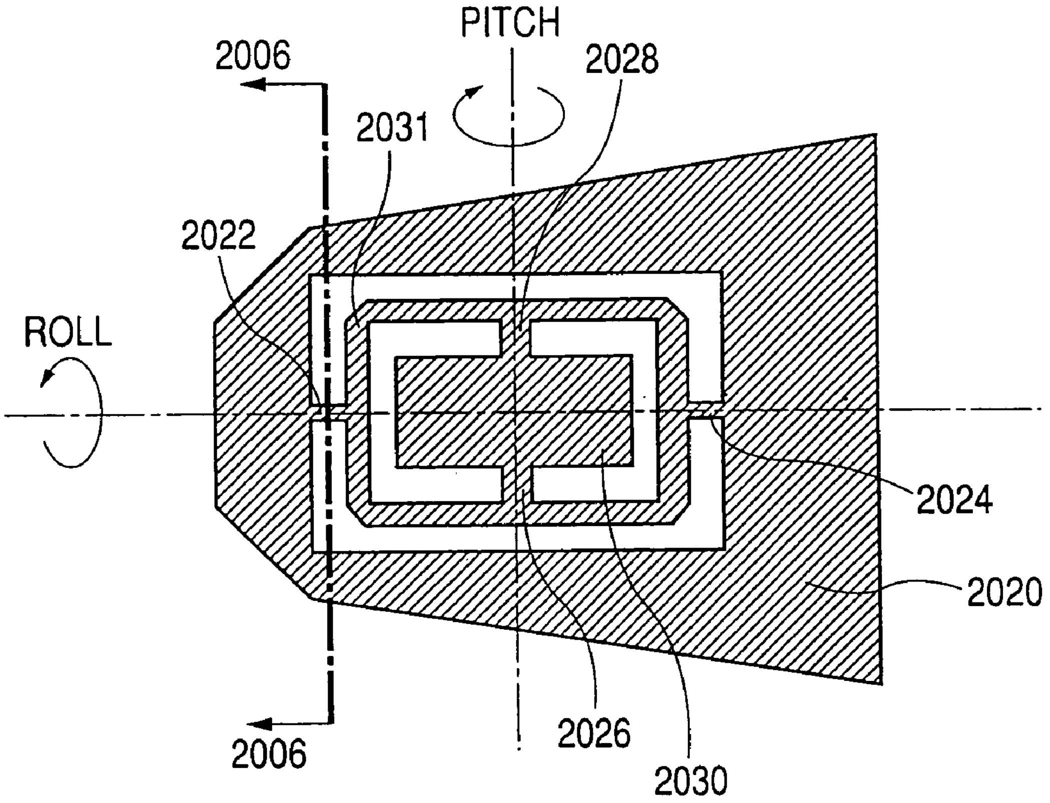
FIG. 14 (PRIOR ART)
FIG. 14 is an illustration showing the hard-disk-head gimbals of the second conventional example.
Figure 15:
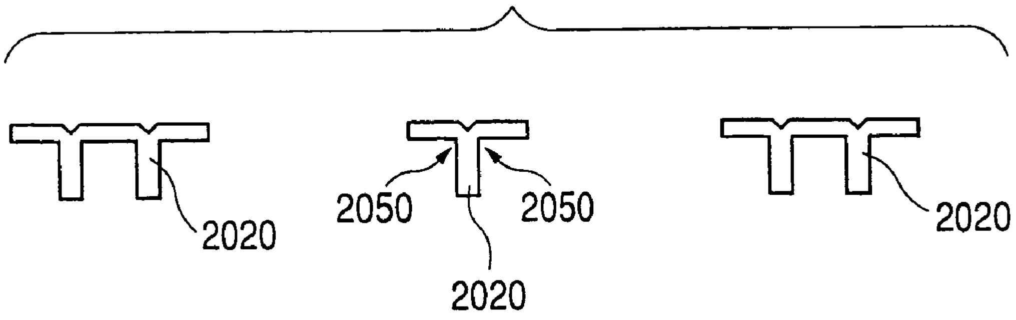
FIG. 15 (PRIOR ART)
FIG. 15 is a sectional view of the hard-disk-head gimbals of the second conventional example in FIG. 14.
Figure 16:
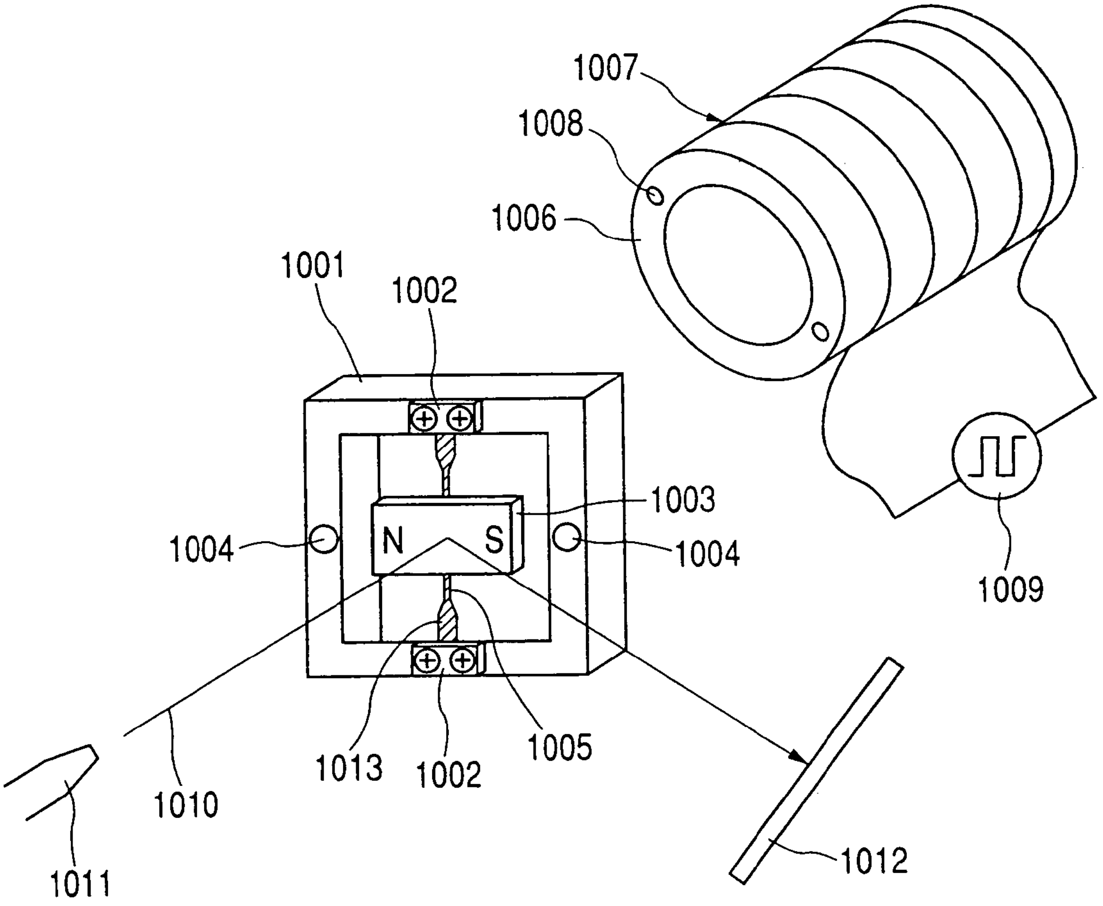
FIG. 16 (PRIOR ART)
FIG. 16 is an illustration showing the optical deflector of the first conventional example.

FIG. 13 is an illustration showing another embodiment of the optical apparatus using the above micro optical deflector. In this case, an electrophotographic image-forming apparatus is shown as an optical apparatus. In FIG. 13, numeral 201 denotes the micro optical deflector of the first embodiment which is used as an optical scanner system for one-dimensionally scanning incident light in the case of the fourth embodiment. Numeral 202 denotes a laser beam source. Numeral 203 denotes a lens or a lens group, 204 denotes a write lens or a write lens group and 206 denotes a photosensitive member. A laser beam emitted from the laser beam source undergoes predetermined intensity modulation relating to light scanning timing and performs one-dimensional scanning by the micro optical deflector 201. The laser beam used for the scanning forms an image on the photosensitive member 206 by the write lens 204.

The photoconductor 206 is uniformly electrified by an electrification unit (not shown) and forms an electrostatic latent image on the surface of the photosensitive member 206 by scanning the surface with a beam. Then, a toner image is formed at the image portion of the electrostatic latent image by a development unit (not shown) and an image is formed on a sheet (not shown) by transferring and fixing the toner image to and on the sheet.

As described in accordance with the above embodiments, a microstructure of the present invention is capable of moderating stress concentration on the joint between an elastic support portion, movable plate and support substrate at the time of torsion driving, preventing the elastic support portion from breaking and having a large displacement angle and a long service life by forming a concave portion on the elastic support portion, constituting the elastic support portion so that a section in which the concave portion is not formed is formed at the both ends of a section in which the concave portion is formed and connecting the section in which the concave portion is not formed with the movable plate and support substrate.

Moreover, by forming the concave portion, it is possible to realize a mode in which the elastic support portion is easily twisted but it is not easily deflected in the direction for translating and vibrating the movable plate (direction vertical to torsion axis) and realize a microstructure to be driven in accordance with stable torsional vibration having less unnecessary vibration due to disturbance or the like.

Therefore, it is possible to realize a microstructure having a small size, a long service life and less unnecessary vibration even for a large displacement angle.

What is claimed is:

1. A micro optical deflector comprising:

a support substrate;

a movable plate;

an elastic support portion comprising a first section having at least one concave portion, and second sections having no concave portions, the second sections arranged at both longitudinal ends of the first section and connecting with the movable plate and the support substrate, respectively, wherein a cross section of the concave portion in a vertical direction to a torsion axis has a substantially V-shape, and wherein the movable plate is supported by the elastic support portion so that the movable plate can be freely torsion-vibrated to the support substrate about the torsion axis; and driving means for relatively driving the support substrate and the movable plate, and a reflection plane formed on the movable plate to reflect light.

2. The micro optical deflector according to claim 1, wherein a length of the first section is not shorter than a half of the entire length of the elastic support portion in a direction of the torsion-axis.

3. The micro optical deflector according to claim 1, wherein the first section has a third section in which a depth of the concave portion increases as approaching the center of the first section along a direction of the torsion-axis, and wherein the third section connects with the second section.

4. The micro optical deflector according to claim 1, wherein the support substrate, the elastic support portion, the movable plate and the concave portion are integrally formed of a single-crystal material.

5. The micro optical deflector according to claim 4, wherein the single-crystal material is single-crystal silicon.

6. The micro optical deflector according to claim 5, wherein the elastic support portion is constituted by equivalent planes of a silicon crystal plane.

7. The micro optical deflector according to claim 5, wherein the concave portion is constituted by an equivalent plane of a silicon crystal plane.

8. An optical apparatus comprising the micro optical deflector of claim 1.

9. An image display apparatus comprising a light source and a micro optical deflector or a micro optical deflector group in which at least one micro optical deflector of claim 1 for deflecting the light emitted from the light source is set, wherein at least a part of the light deflected by the micro optical deflector or micro optical deflector group is projected onto an image display body.

* * * * *

UNITED STATES PATENT AND TRADEMARK OFFICE
CERTIFICATE OF CORRECTION

PATENT NO. : 7,061,063 B2
APPLICATION NO. : 10/608111
DATED : June 13, 2006
INVENTOR(S) : Takahisa Kato et al.

It is certified that error appears in the above-identified patent and that said Letters Patent is hereby corrected as shown below:

On the Title Page
Item [56] REFERENCES CITED:

OTHER PUBLICATIONS, “10 International” should read --$10^{th}$ International--.

On the Title Page
Item [57] ABSTRACT:

Line 4, “portion.” should read --portions--.

COLUMN 2:

Line 2, “canned” should read --scanned--.
Line 9, “Example” should read --Example)--.

COLUMN 5:

Line 33, “plate.” should read --plate--.

COLUMN 6:

Line 41, “±1020.” should read --±10°.--.
Line 43, “potion” should read --portion--.

UNITED STATES PATENT AND TRADEMARK OFFICE

CERTIFICATE OF CORRECTION

PATENT NO. : 7,061,063 B2
APPLICATION NO. : 10/608111
DATED : June 13, 2006
INVENTOR(S) : Takahisa Kato et al.

It is certified that error appears in the above-identified patent and that said Letters Patent is hereby corrected as shown below:

COLUMN 11:

Line 28, "numeral" should read --numeral.--.

Signed and Sealed this

Sixth Day of November, 2007

JON W. DUDAS

*Director of the United States Patent and Trademark Office*